United States Patent
Lu et al.

(10) Patent No.: US 9,612,531 B2
(45) Date of Patent: *Apr. 4, 2017

(54) METHOD OF FABRICATING AN INTEGRATED CIRCUIT WITH ENHANCED DEFECT REPAIRABILITY

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 187 days.

This patent is subject to a terminal disclaimer.

(21) Appl. No.: 14/221,362

(22) Filed: Mar. 21, 2014

(65) Prior Publication Data

US 2015/0268561 A1 Sep. 24, 2015

(51) Int. Cl.
*G03F 1/72* (2012.01)
*G03F 7/20* (2006.01)
*G03F 1/24* (2012.01)

(52) U.S. Cl.
CPC .............. *G03F 1/72* (2013.01); *G03F 1/24* (2013.01); *G03F 7/701* (2013.01); *G03F 7/7065* (2013.01); *G03F 7/70191* (2013.01)

(58) Field of Classification Search
CPC ........ G03F 1/72; G03F 7/701; G03F 7/70191; G03F 7/7065; G03F 1/24; G03F 1/84
See application file for complete search history.

(56) References Cited

U.S. PATENT DOCUMENTS

| 2007/0229944 A1* | 10/2007 | Lee ..................... G03F 7/70308 359/359 |
| 2009/0053618 A1* | 2/2009 | Goehnermeier ........ G03F 7/701 430/5 |
| 2013/0198697 A1* | 8/2013 | Hotzel ..................... G03F 1/24 716/51 |
| 2014/0078479 A1 | 3/2014 | McIntyre et al. |
| 2014/0268086 A1 | 9/2014 | Lu et al. |

FOREIGN PATENT DOCUMENTS

EP 1137967 B1 2/2006

OTHER PUBLICATIONS

Taiwan Patent Office, Taiwanese Office Action dated May 9, 2016, Application No. 10-2014-0153649 filed Nov. 6, 2014.
Korean Patent Office, Korean Office Action dated Feb. 18, 2016, Application No. 10-2014-0153649 filed Nov. 6, 2014, 10 pages.

* cited by examiner

*Primary Examiner* — Michelle M Iacoletti
(74) *Attorney, Agent, or Firm* — Haynes and Boone, LLP

(57) ABSTRACT

The present disclosure provides one embodiment of a method for extreme ultraviolet lithography (EUVL) process. The method includes loading a mask to a lithography system. The mask includes defect-repaired regions and defines an integrated circuit (IC) pattern thereon. The method also includes setting an illuminator of the lithography system in an illumination mode according to the IC pattern, configuring a pupil filter in the lithography system according to the illumination mode and performing a lithography exposure process to a target with the mask and the pupil filter by the lithography system in the illumination mode.

20 Claims, 8 Drawing Sheets

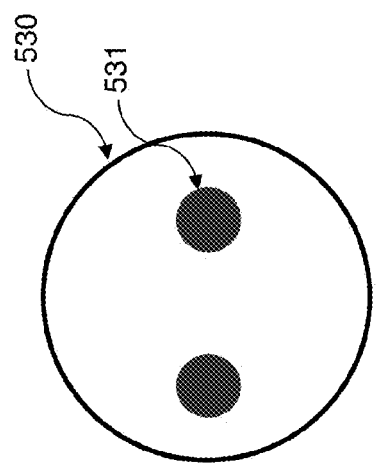
FIG. 8A
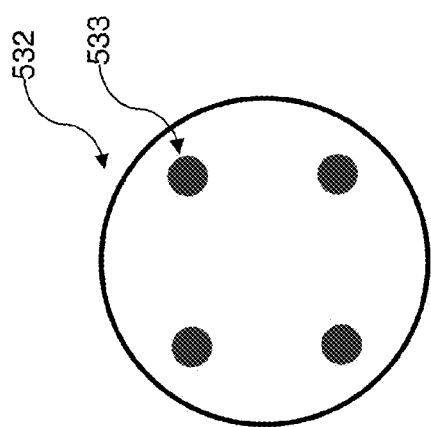
FIG. 8B
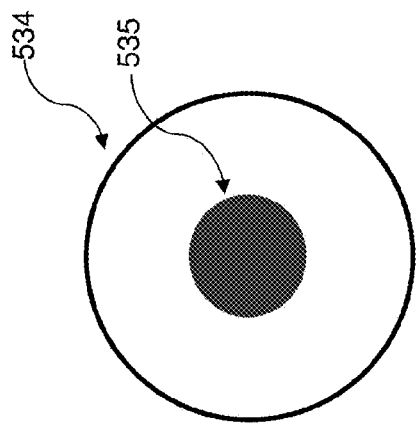
FIG. 8C
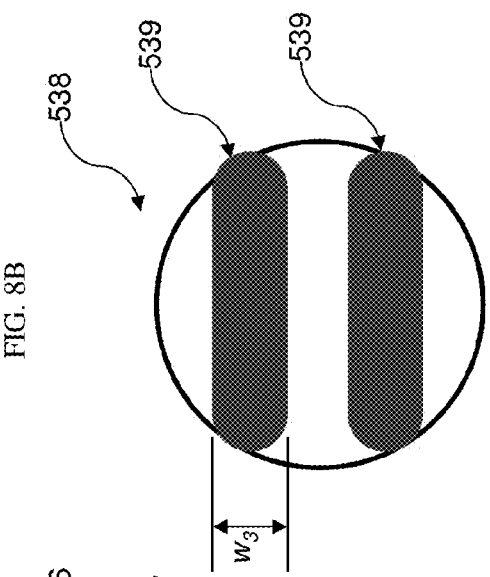
FIG. 9A
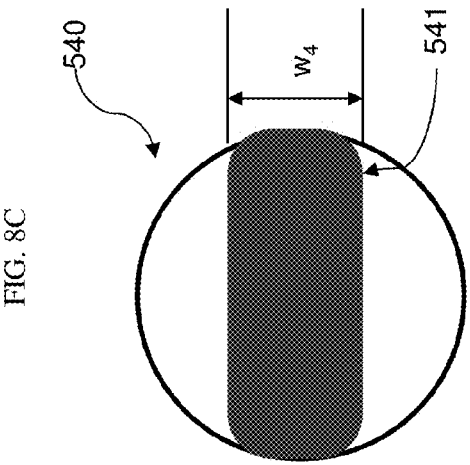
FIG. 9B
FIG. 9C

METHOD OF FABRICATING AN INTEGRATED CIRCUIT WITH ENHANCED DEFECT REPAIRABILITY This disclosure is related to patent application Ser. No. 14/206,516 filed Mar. 12, 2014, as "An Extreme Ultraviolet Lithography Process and Mask." The entire disclosures of which are hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique used to address this need is extreme ultraviolet lithography (EUVL). Other techniques include X-Ray lithography, ion beam projection lithography, electron beam projection lithography, and multiple electron beam maskless lithography.

EUVL employs scanners using light in the extreme ultraviolet (EUV) region, having a wavelength of about 1-100 nm. Some EUV scanners provide 4× reduction projection printing, similar to some optical scanners, except that the EUV scanners use reflective optics, e.g., mirrors, where optical scanners use refractive optics, e.g., lenses. EUV scanners provide the desired pattern on an absorption layer ("EUV" mask absorber) formed on a reflective mask. Masks used in EUVL presents new challenges. For example, a multi-layer (ML) structure is used in an EUVL mask and a microscopic non-flatness (caused by a defect, for example) on a surface of the substrate of the EUV mask may deform the films deposited subsequently thereon. When an incident light is reflected from a deformed region, it may experience a phase difference with respect to a light reflected from a normally formed region. Sometimes a defect introduces a phase difference close to 180°, referred to as a phase defect. A phase defect may affect print fidelity and result in severe pattern distortion on a substrate. It is desired to provide an efficient and a feasible method to reduce and/or mitigate the printability of phase defects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 8A to 8C illustrate schematic views of illumination patterns implemented by the method of FIG. 7, in accordance with some embodiments.

FIGS. 9A to 9C illustrate schematic views of filtering patterns implemented by the method of FIG. 7, in accordance with some embodiments.

DETAILED DESCRIPTION

Figure 1:
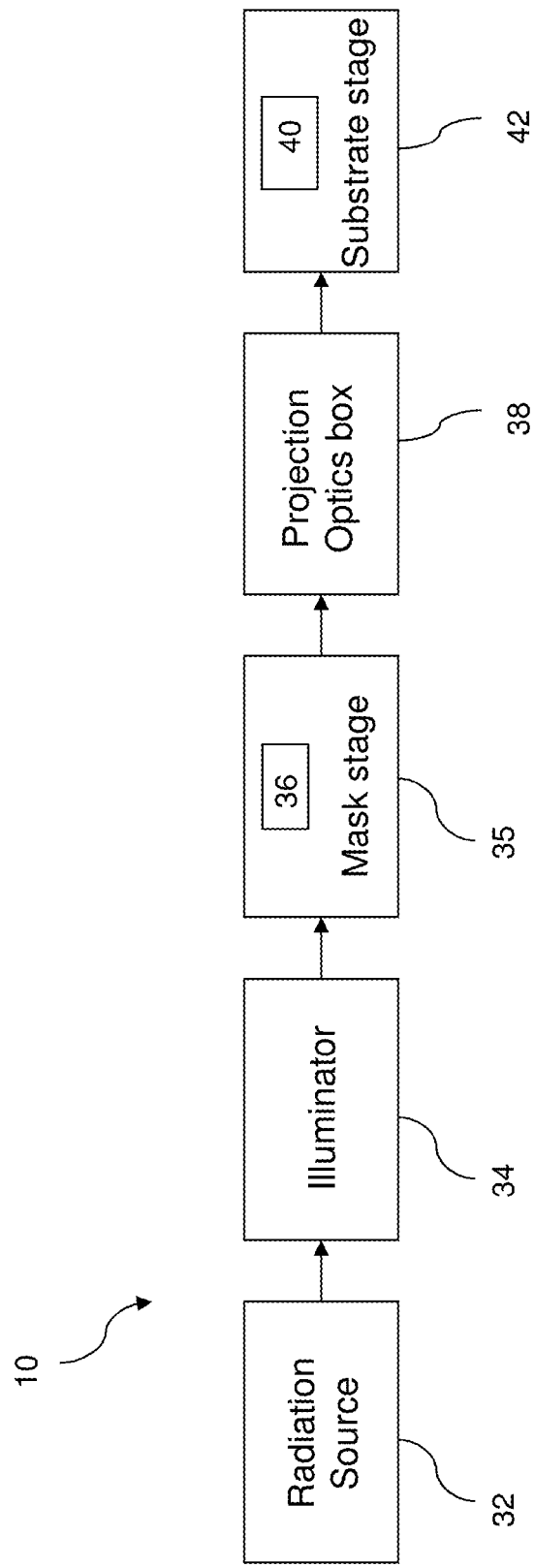
FIG. 1 is a block diagram of a lithography system for implementing a mask structure constructed in accordance with some embodiments.

It is understood that the following disclosure provides many different embodiments, or examples, for implementing different features of the invention. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Referring to FIG. 1, an EUV lithography system 10 that may benefit from one or more embodiments of the present invention is disclosed. The lithography system 10 is also illustrated, in portion, in a schematic view. In the present embodiment, the lithography system 10 is an extreme ultraviolet (EUV) lithography system designed to expose a resist layer by EUV. The resist layer is sensitive to the EUV radiation. The EUV lithography system 10 employs a radiation source 32 to generate EUV light, such as EUV light having a wavelength ranging between about 1 nm and about 100 nm. In one particular example, the EUV radiation source 32 generates a EUV light with a wavelength centered at about 13.5 nm.

The EUV lithography system 10 also employs an illuminator 34. In various embodiments, the illuminator 34 includes various refractive optic components, such as a single lens or a lens system having multiple lenses (zone plates) or reflective optics, such as a single mirror or a mirror system having multiple mirrors in order to direct light from the radiation source 32 onto a mask 36. In the present embodiment where the radiation source 32 that generates light in the EUV wavelength range, reflective optics are employed. Refractive optics, however, can also be realized by zoneplates for example. In the present embodiment, the illuminator 34 is operable to configure the mirrors to provide an off-axis illumination (OAI) to illuminate the mask 36. In one example, the mirrors of the illuminator 34 are switchable to reflect EUV light to different illumination positions. In another embodiment, a stage prior to the illuminator 34 may additionally include other switchable mirrors that are controllable to direct the EUV light to different illumination positions with the mirrors of the illuminator 34. Accordingly, the lithography system 10 is able to achieve different illumination modes without sacrificing the illumination energy.

The EUV lithography system 10 also includes a mask stage 35 configured to secure a photomask 36 (in the present disclosure, the terms of mask, photomask, and reticle are used to refer to the same item). The mask 36 may be a transmissive mask or a reflective mask. In the present embodiment, the mask 36 is a reflective mask such as described in further detail below.

The EUV lithography system 10 also employs the POB 38 for imaging the pattern of the mask 36 on to a target 40 (such as a semiconductor wafer) secured on a substrate stage 42 of the lithography system 10. The POB 38 may have refractive optics and/or reflective optics. The radiation reflected from the mask 36 (e.g., a patterned radiation) is collected by the POB 38. In one embodiment, the POB 38 may include a magnification of less than one (thereby reducing the patterned image included in the radiation).

The structure of the mask 36 and the method making the same will be further described later according to various embodiments. The mask fabrication process includes two operations: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. Several masks (for example, a set of 15 to 30 masks) may be used to construct a complete IC. In general, various masks are fabricated for being used in various processes.

The following description refers to the mask 36, mask fabrication and mask repairing processes. The mask fabrication and repairing processes include three steps: a blank mask fabrication process, a mask patterning process, and a mask repairing process. During the blank mask fabrication process, a blank mask is formed by depositing suitable layers (e.g., multiple reflective layers) on a suitable substrate. The blank mask is patterned during the mask patterning process to have a design pattern for a corresponding layer of an integrated circuit (IC) device (or chip). A mask repairing process may be implemented before or after the mask patterning process to mitigate the printability of defects on the blank mask or on the patterned mask. After repairing, the patterned mask is then used to transfer the design pattern onto a semiconductor wafer.

In general, various masks are fabricated for use in various processes. Types of EUV masks include binary intensity masks (BIM) and phase-shifting masks (PSM). An example BIM includes an almost totally absorptive region (also referred to as a dark region) and a reflective region. In the opaque region, an absorber is present and an incident light is almost fully absorbed by the absorber. In the reflective region, the absorber is removed and the incident light is reflected by a multilayer (ML). A PSM includes an absorptive region and a reflective region. The phase difference (generally) 180° between a portion of a light reflected from the absorptive region and a portion of the light reflected from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Figure 2:
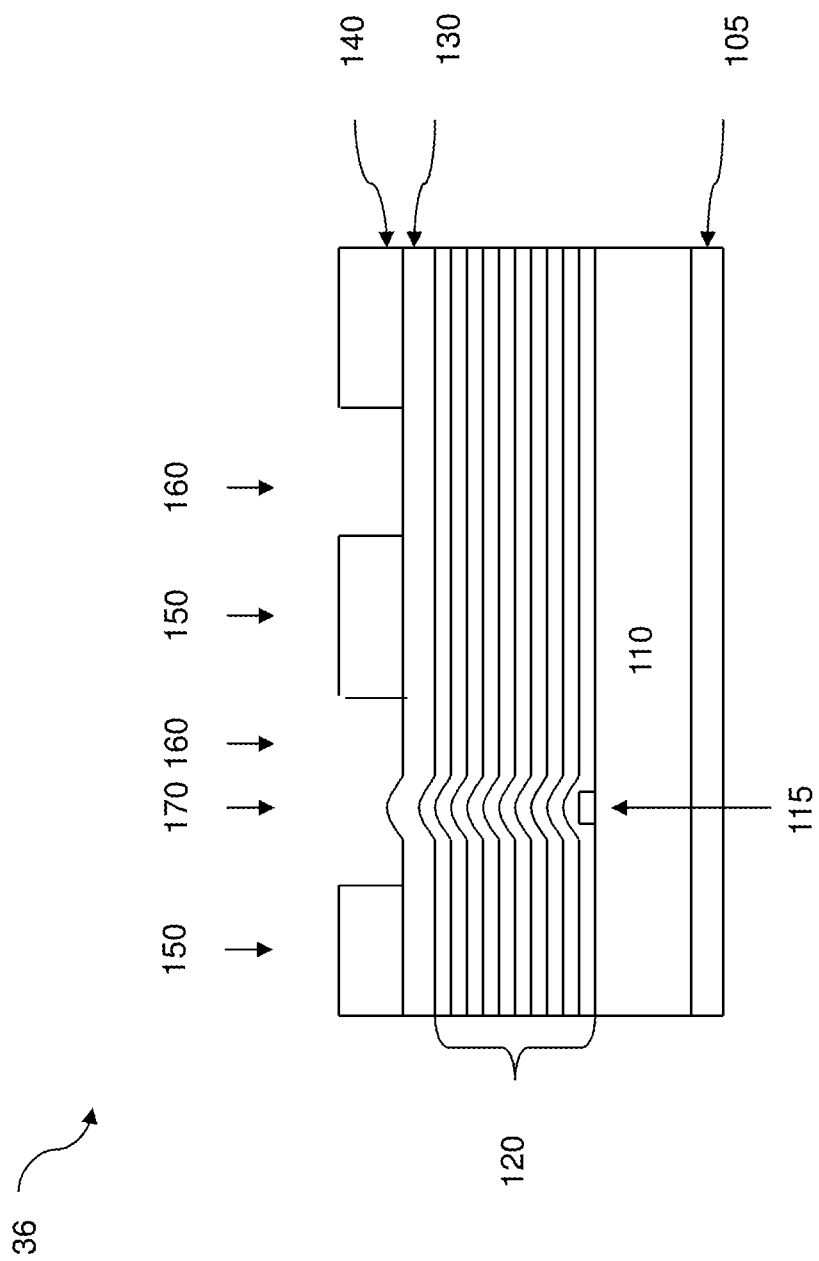
FIG. 2 is a schematic view of the semiconductor substrate of FIG. 1, in portion, constructed in accordance with some embodiments.

Referring to FIG. 2, the mask 36 includes a mask substrate 110 made of low thermal expansion material (LTEM). The LTEM material may include $TiO_2$ doped $SiO_2$, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be formed on the backside surface of the LTEM substrate 110 (as shown in the figure) for the electrostatic chucking purpose. In an embodiment, the conductive layer 105 includes chromium nitride (CrN), or other suitable conductive material.

The mask 36 includes a reflective multilayer (ML) 120 disposed over the mask substrate 110 on the front surface. According to Fresnel equations, light reflection will occur when light propagates across the interface between two materials of different refractive indices. The reflected light is larger when the difference of refractive indices is larger. To increase the reflected light, one may also increase the number of interfaces by depositing a multilayer of alternating materials and let light reflected from different interfaces interfere constructively by choosing an appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any suitable material that is highly reflective at EUV wavelengths. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type and/or wavelength. In a typical example, the number of the film pairs in the ML 120 ranges from 20 to 80, however any number of film pairs is possible. In one example, the ML 120 includes forty pairs of layers of Mo/Si. Each Mo/Si film pair has a thickness of about 7 nm, with a total thickness of 280 nm. In this case, a reflectivity of about 70% is achieved.

The mask 36 includes a protection layer 130 formed over the ML 120 for one or more functions. In one example, the protection layer 130 functions as an etch stop layer in a patterning process or other operations, such as repairing or cleaning. In another example, the capping layer functions to prevent oxidation of the ML 120. The protection layer 130 may include one a single film or multiple films to achieve the intended functions. In some embodiments, the protection layer includes a capping layer disposed over the ML 120 and a buffer layer disposed over the capping layer. The capping layer is designed to prevent oxidation of the ML 120. In some examples, the capping layer includes silicon with about 4-7 nm thickness. In other examples, a low temperature deposition process may be chosen to form the capping layer to prevent inter-diffusion of the ML 120. The buffer layer is formed over the capping layer to act as an etching stop layer in a patterning or repairing process of an absorption layer. The buffer layer has different etching characteristics from the absorption layer. In some examples, the buffer layer includes ruthenium (Ru), Ru compounds such as RuB, RuSi, chromium (Cr), Cr oxide, and Cr nitride. A low temperature deposition process is often chosen for the buffer layer to prevent inter-diffusion of the ML 120.

The mask 36 also includes an absorption layer 140 is formed over the protection layer 130. In the present embodiment, the absorption layer 140 absorbs radiation in the EUV wavelength range projected onto a patterned mask. The absorption layer 140 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. With a proper configuration of multiple film layers, the absorption layer 140 will provide process flexibility in a subsequent etching process by different etch characteristics of each film.

Then, the absorption layer 140 is patterned according to an IC layout pattern (or simply IC pattern). The absorption layer 140 is patterned to define opaque regions 150 and reflective regions 160. In the opaque region 150, the absorption layer 140 remains while in the reflective region 160, the absorption layer 140 is removed.

In the present embodiment, the mask 36 includes at least one defect 115. The defect 115 may include such things as a bump or a pit on the surface of the LTEM substrate 110 (beneath the reflective ML 120) or embedded in the reflective ML 120. The defect 115 may form during fabricating the LTEM substrate 110, the reflective ML 120, or any other process. The defect 115 may cause local deformation of all subsequent layers over it to form a deformation region, referred to as a defect region 170. In the present embodiment, at least one of the reflective regions 160 includes a defect region 170. The defect region 170 may have a large impact on the phase of the light ray reflected from the reflective region 160 where the defect region 170 is located. This is the reason why the defect region 170 is also referred to as the phase-defect region 170. For example, assuming conformal deposition of all subsequent layers, a defect 115 of height or depth of one fourth of the wavelength of the radiation source 32 can cause a 180° phase error for a light ray reflected from this region. In fact, a relatively small fraction of the 180° phase error, e.g., 30°, can have a prominent impact on the lithographic process window or even cause patterning fidelity problems. Therefore, a defect-free LTEM substrate 110 and a defect-free reflective ML 120 are desired. However, this puts constraints in a mask fabrication and may make the mask fabrication become more expensive. The present disclosure offers a method 200 to reduce impacts of the phase-defect region 170. A part of the method 200 is repairing the mask, which will be described in a first subset of method 200, and another part of the method 200 is applying a lithography process using the repaired mask (repaired in the first subset of method 200) with a designed pupil filer pattern, which will be described in a second subset of method 200.

Figure 3:
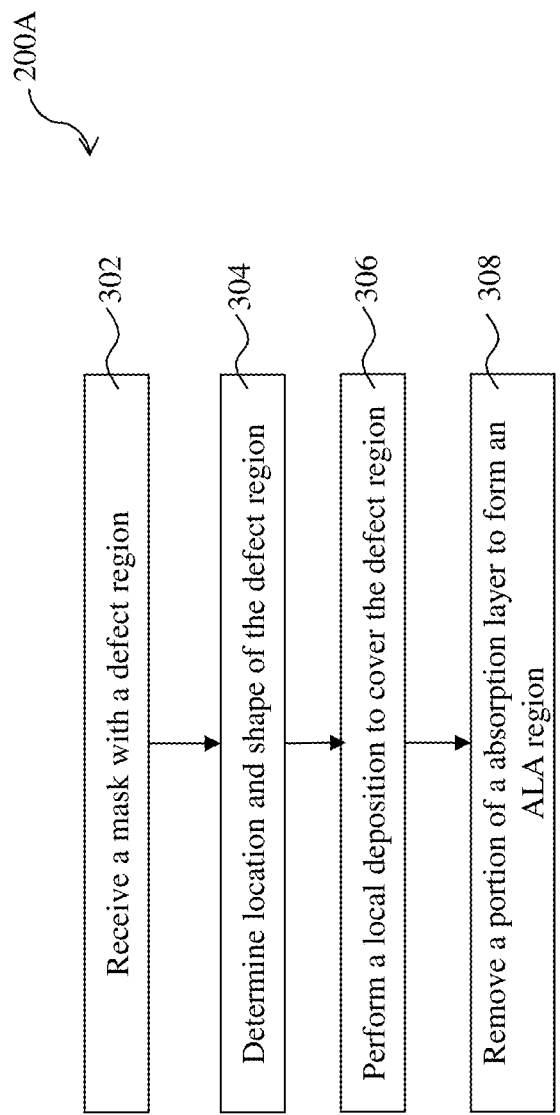
FIG. 3 is a flowchart of a mask repairing process constructed in accordance with some embodiments.
Figure 4:
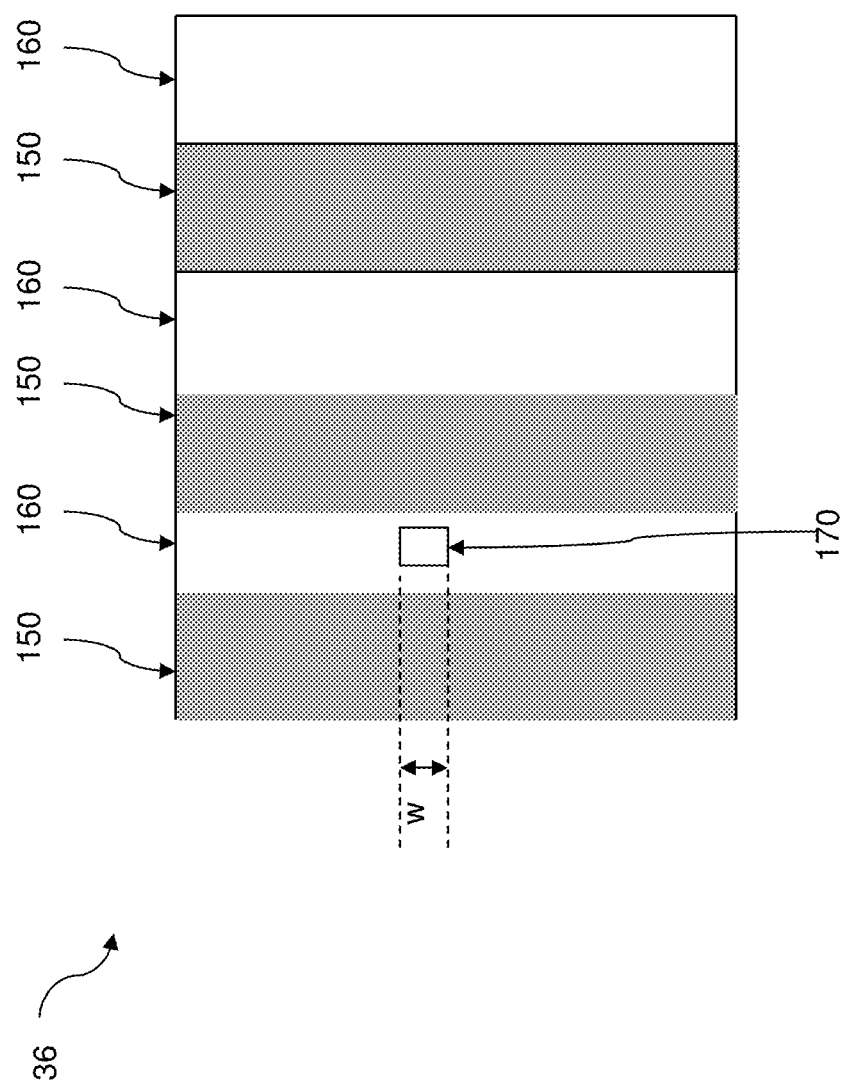
FIGS. 4 to 6 are diagrammatic top views of a patterned EUV mask in various stages in accordance with some embodiments.
Figure 5:
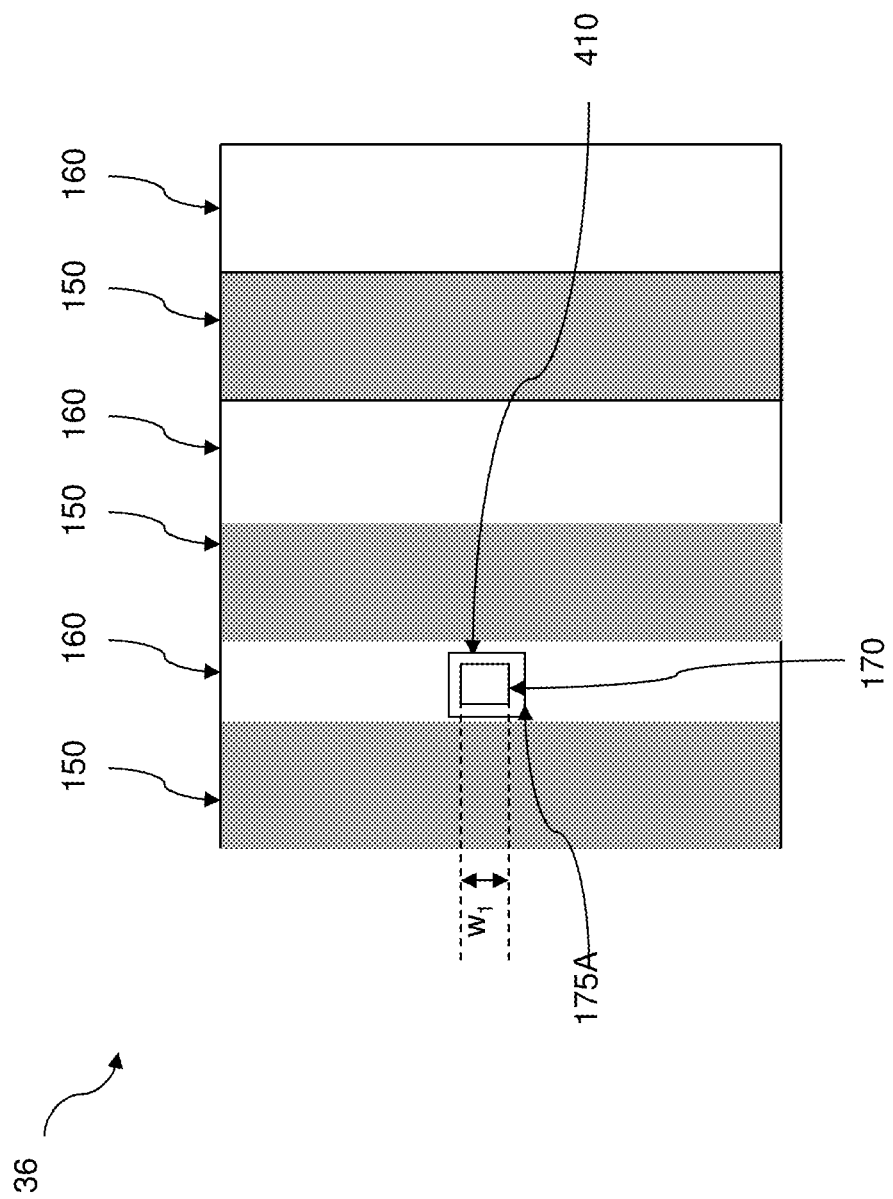
Figure 6:
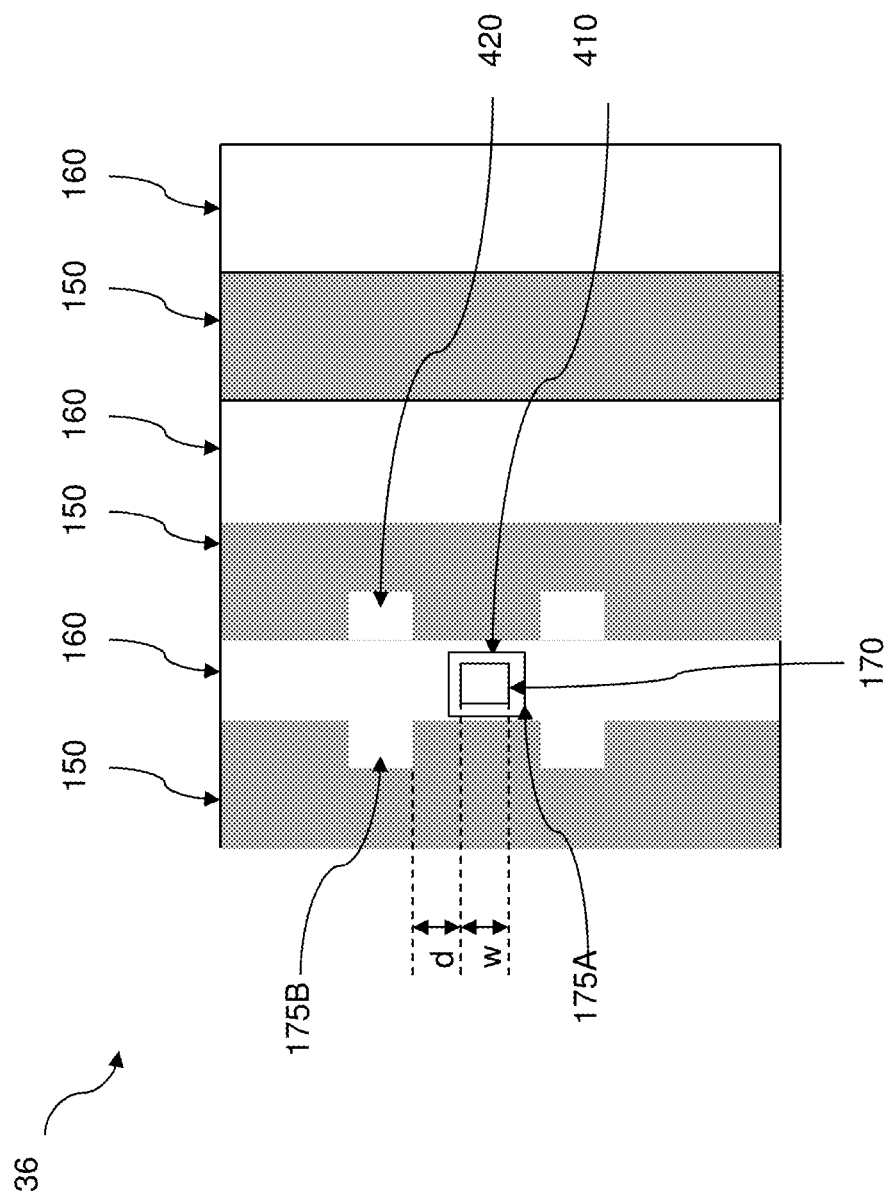

FIG. 3 is a flowchart of the first subset of steps of an extreme ultraviolet lithography (EUVL) process, the subset being referred to as the method 200A. The method 200A can be used for repairing an EUV mask constructed in accordance with some embodiments. FIGS. 4 to 6 are diagrammatic top views of a patterned EUV mask at various repairing stages of the method 200A.

Referring to FIGS. 3 and 4, the method 200A starts at step 302 by receiving the mask 36. The mask 36 includes the opaque regions 150, the reflective regions 160 and at least one defect region 170 in the reflective region 160.

Referring to FIG. 3, the method 200A proceeds to step 304 by determining a location and a shape of the defect region 170. The location and shape of the defect region 170 may be detected by atomic force microscope (AFM), aerial image metrology system (AIMS™, by Carl Zeiss) or other defect metrology tools. The 2D information is in a plane which is parallel to the surface of the LTEM substrate 110. A detailed three-dimensional (3D) profile of the defect region 170, which is necessary for a more accurate determination of the resultant phase error, can be used in an alternative embodiment. In one embodiment, the defect region 170 is detected to have a first width $w_1$, which is along a direction of the opaque region 150.

Referring to FIGS. 3 and 5, the method 200A proceeds to step 306 by performing a local deposition to cover the defect region 170 with an absorber material 410. After being covered by the absorber material 410, the reflectivity in the defect region 170 becomes small, e.g., smaller than 3%. Thus, the phase shift, no matter how large it is, is reduced. The absorber material 410 may contain chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. The absorber material 410 is deposited locally by using gas-assisted focused-electron-beam-induced deposition, or any other suitable method. In one embodiment, a shape of the deposited absorber material 410 corresponds to the defect region 170. Covered by the absorber material 410, the defect region 170 is converted to a defect-repaired region 175.

Referring to FIGS. 3 and 6, the method 200A proceeds to step 308 by removing a portion of the absorption layer 140 to form absorption-layer-absent (ALA) regions 420. The ALA regions 420 provide additional reflected light rays to compensate for intensity loss caused by the defect-repaired region 175. The ALA region 420 is formed by a suitable technique, such as focused-ion-beam etching or focused-electron-beam-induced etching. The ALA region 420 may could be form in an appropriate region which is not adjacent to the defect-repaired region 175 to avoid adverse impact of the defect region 170. In another word, the ALA region 420 is selected to a more defect free region from the defect region 170. In one embodiment, each of the ALA regions 420 is separated by a distance d from the defect-repaired region 170 and the distance is more than about 20 nm. An extent of the ALA region 420 is related to the location and the shape of the defect-repaired region 175. Alternatively, the extent of the ALA region 420 can be determined by a feedback loop involving aerial image or resist image metrology (by AIMS for a mask or by SEM for a wafer) and mask repair. Simulation can also be employed if an accurate model is provided. After finishing the repairing process, the repaired mask 36 is referred to as a repaired mask 37.

Additional steps can be provided before, during, and after the method 200A, and some of the steps described can be replaced, eliminated, or moved around for additional embodiments of the method 200A.

Figure 7:
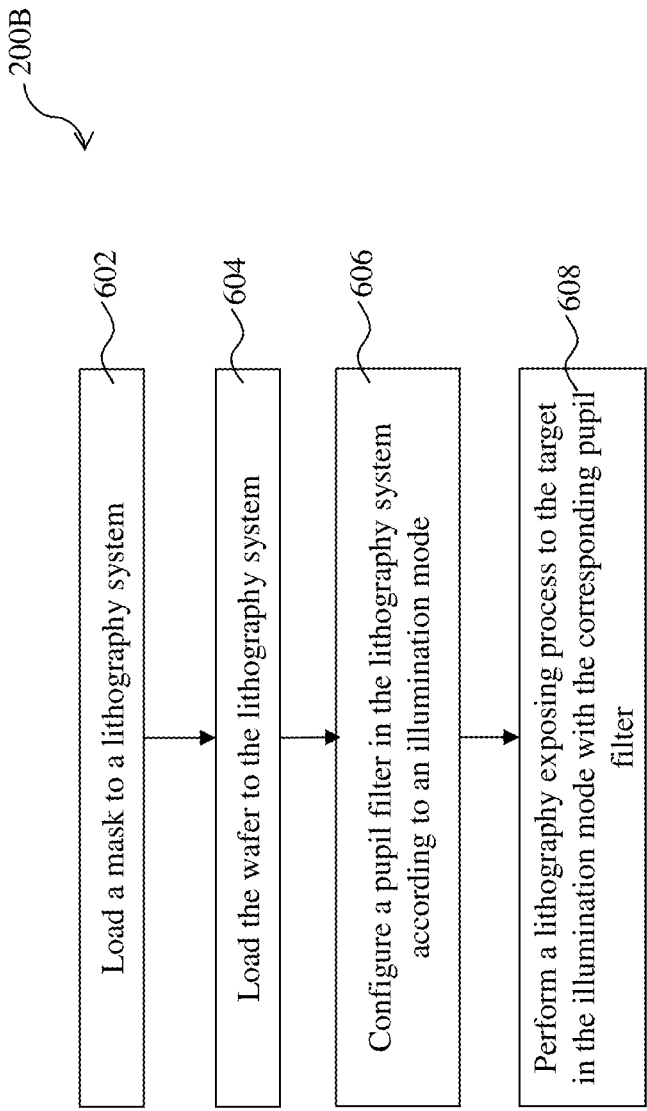
FIG. 7 is a flowchart of a lithography process constructed in accordance with some embodiments.

FIG. 7 is a flowchart of the second subset of steps of the EUVL process discussed above, the second subset being referred to as method 200B. The method 200B is used for performing a lithography process in an integrated circuit fabrication constructed according to aspects of the present disclosure in various embodiments. FIGS. 8A to 8C illustrate schematic views of illumination patterns implemented by the method 200B. FIGS. 9A to 9C illustrate schematic views of filtering patterns implemented by the method 200B.

Referring to FIGS. 1 and 7, the method 200B includes an operation 602 by loading to a lithography system 10 with the repaired mask 37. The operation 602 in the method 200B may further include other steps, such as alignment after the repaired mask 37 is secured on the mask stage.

The method 200B also includes an operation 604 to load a target 40 to the substrate stage 42 of the lithography system 10. In the present embodiment, the target 40 is a semiconductor substrate, such as a silicon wafer. The target 40 is coated with a resist layer that is sensitive to the EUV light. The resist layer is to be patterned by a lithography exposure process such that the IC design layout (IC pattern) of the repaired mask 37 is transferred to the resist layer.

Referring to FIGS. 1 and 7, the method of 200B also includes an operation 606 by configuring a pupil filter in the lithography system 10. The pupil filter is configured in a pupil plane of the lithography system 10. In an image optical system, there is a plane with field distribution corresponding to Fourier Transform of object (the repaired mask 37 in the present case). This plane is called pupil plane. The pupil filter is placed in the pupil plane to filter out predetermined portion of the EUV light from the repaired mask 37. The pupil filter allows a portion of the reflected light pass through to expose the target 40 to reduce resolution of the defect region 170.

In the present embodiment, the illuminator 34 includes various switchable mirrors or mirrors with other suitable mechanism to tune the reflections of the EUV light from those mirrors. In furtherance of the present embodiment, the off-axis illumination mode is achieved by configuring the switchable mirrors in the illumination stage such as the EUV light from the radiation source 32 is directed into a pattern (such as those shown in FIGS. 8A-8C) to achieve the off-axis illumination.

The illumination mode may include different patterns, such as those examples in FIGS. 8A-8C. The illumination pattern is determined according to the IC pattern defined on the repaired mask 37 for the expected purpose that includes enhancing the intensity of the EUV light during the lithography exposure process.

In FIG. 8A, the illumination mode has a dipole pattern located on an axis, where the dipole portion 531 stands for a portion in "on" state (illumination) and the other portions are in "off" state (blocking). In other words, the EUV light reaching the dipole portion 531 will be directed to the repaired mask 37 while the EUV light reaching the "off" portions will be blocked.

In FIG. 8B, the illumination mode has a quasar pattern 532 where the quasar portions 533 are in "on" state and the rest portions are in "off" state. In other words, the EUV light reaching the quasar portions 533 will be directed to the repaired mask 37 while the EUV light reaching the rest portions will be blocked.

In FIG. 8C, the illumination mode has a disk pattern 534 where the disk portion 535 stands for a portion in "on" state (illumination) and the other portions are in "off" state (blocking). In other words, the EUV light reaching the disk portion 535 will be directed to the repaired mask 37 while the EUV light reaching the "off" portions will be blocked.

The pattern defined in the pupil filter is determined by the illumination mode. In one embodiment, when the illumination mode is defined as the dipole pattern 530 in FIG. 8A, the corresponding pupil filter will have a pattern 536 with an opening 537 along a same axis of the dipole pattern 530, as illustrated in FIG. 9A. The opening 537 is in the "on" state where the EUV light reaches this portion in the pupil plane will be directed to the target 40. The EUV light reaches to other portion in the pupil plane will be blocked. The opening 537 is formed with a second width $w_2$. In one embodiment, the second width $w_2$ is larger than a diameter of the dipole portion 531 but less than about 50% of a diameter of the illumination mode.

When the illumination mode is the quasar pattern 532, defined in FIG. 8B, the corresponding pupil filter will have a pattern 538 with two openings 539 parallel to each other, as illustrated in FIG. 9B. The openings 539 are in the "on" state where the EUV light reaches this portion in the pupil plane will be directed to the target 40. The EUV light reaches to other portion in the pupil plane will be blocked. The opening 539 is formed with a third width $w_3$. In one embodiment, the third width $w_3$ is larger than a diameter of the quasar portion 533 but less than about 25% of a diameter of the illumination mode.

When the illumination mode is the disk pattern 534, defined in FIG. 8C, the corresponding pupil filter will have a patterns 540 with an opening 541, as illustrated in FIG. 9C. The opening 541 is in the "on" state where the EUV light reaches this portion in the pupil plane will be directed to the target 40. The EUV light reaches to other portion in the pupil plane will be blocked. The opening 541 is formed with a fourth width $w_4$. In one embodiment, the fourth width $w_4$ is larger than a diameter of the disk portion 535 but less than 50% of a diameter of the illumination.

Referring back to FIGS. 1 and 7, the method 200B proceeds to operation 608 by performing a lithography exposure process to the target 40 in the configured illumination mode and the pupil filter. The EUV light from the radiation source 32 is modulated by the illuminator 34 with the EUV energy distribution for the off-axis illumination, directed from the repaired mask 37, and further filtered by the pupil filter, the EUV light images the IC pattern of the repaired mask 37 to the target 40. With each respective pattern of the pupil filter, a predetermined amount of the diffraction light is blocked by the pupil filter to reduce resolution of the defect region 170 and that enhances defect reparability.

Additional steps can be provided before, during, and after the method 200B, and some of the steps described can be replaced, eliminated, or moved around for additional embodiments of the method 200B.

Based on the above, the present disclosure offers a method for extreme ultraviolet lithography (EUVL) process. The method employs a pattern for a pupil filter to block a portion of diffraction light to path through, that reduces resolution of defect. The method also employs repairing a mask by forming an absorption-layer-absent region in a region which is far away from the defect (or a more defect free region) to avoid adverse impact of the defect region. The method demonstrates significantly enhancing defect reparability.

Thus, the present disclosure provides one embodiment of a method for extreme ultraviolet lithography (EUVL) process. The method includes loading a mask to a lithography system. The mask includes a reflective region, an opaque region, a defect-repaired region over a defect in the reflective region and an absorption-layer-absent (ALA) region in the opaque region. The method also includes configuring a pupil filter in the lithography system according to ab illumination mode and performing a lithography exposure process to a target with the mask and the pupil filter by the lithography system in the illumination mode. Therefore, the pupil filter block an amount of reflection light, reflected from the mask, to exposure the target.

The present disclosure provides another embodiment of a method for extreme ultraviolet lithography (EUVL) process. The method includes loading a mask to a lithography system. The mask defines an integrated circuit (IC) pattern thereon. The method also includes configuring a pupil filter in the lithography system according to an illumination mode and performing a lithography exposure process to a target with the mask and the pupil filter by the lithography system in the illumination mode. Therefore, the pupil filter block an amount of reflection light, reflected from the mask, to exposure the target.

The present disclosure also provides another embodiment of a method for extreme ultraviolet lithography (EUVL) process. The method includes loading a mask to a lithography system. The mask includes mask includes a defect-repaired region over a defect in a first region and an absorption-layer-absent (ALA) region in a second region, separated by a distance from the defect-repaired region, and defines an integrated circuit (IC) pattern thereon. The method also includes configuring a pupil filter in the lithography system according to a dipole pattern of the illumination mode to have an opening and performing a lithography exposure process to a target with the mask and the pupil filter by the lithography system in the illumination mode. Therefore, the pupil filter block an amount of reflection light, reflected from the mask, to exposure the target.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for extreme ultraviolet lithography (EUVL), comprising:
   loading a mask to a lithography system, wherein the mask includes:
      a reflective region;
      an opaque region that includes an absorption layer;
      a defect-repaired region over a defect in the reflective region, wherein the defect-repaired region includes an absorber material deposited over the defect; and
      an absorption-layer-absent (ALA) region in the opaque region, wherein the ALA region is formed by removing a portion of the absorption layer in the opaque region;
   configuring a pupil filter in the lithography system according to an illumination mode; and
   performing a lithography exposure process to a target with the mask and the pupil filter by the lithography system in the illumination mode,
   wherein the pupil filter blocks an amount of reflection light, reflected from the mask, to expose the target.

2. The method of claim 1, wherein the mask includes
   a reflective multi-layer (ML) disposed on a mask substrate;
   the absorption layer disposed on the reflective ML and patterned according to an Integrated Circuit (IC) pattern; and
   the defect-repaired region.

3. The method of claim 1, further comprising:
   determining a location and a shape of the defect by an atomic force microscope or by an aerial image metrology system.

4. The method of claim 3, wherein a distance from the ALA region to the defect-repaired region is about 20 nm.

5. The method of claim 1, further comprising setting an illuminator in the illumination mode, and wherein the setting of the illuminator includes setting a plurality of switchable mirrors to achieve an illumination mode with a dipole pattern along an axis.

6. The method of claim 5, wherein the pupil filter is configured to have an opening with a first width along the axis.

7. The method of claim 6, wherein the first width is larger than a diameter of a dipole of the dipole pattern.

8. The method of claim 1, further comprising setting an illuminator in the illumination mode, and wherein the setting of the illuminator includes setting a plurality of switchable mirrors to achieve an illumination mode with a quasar pattern having a plurality of quasar portions.

9. The method of claim 8, wherein the pupil filter is configured to have two openings with a second width, parallel to each other.

10. The method of claim 9, wherein the second width is larger than a diameter of one of the quasar portions.

11. The method of claim 1, further comprising setting an illuminator in the illumination mode, and wherein the setting of the illuminator includes setting a plurality of switchable mirrors to achieve an illumination mode with a disk pattern.

12. The method of claim 11, wherein the pupil filter is configured to have an opening with a third width.

13. The method of claim 12, wherein the third width is larger than a diameter of a disk of the disk pattern.

14. A method for extreme ultraviolet lithography (EUVL) process, comprising:
   loading a mask to a lithography system, the mask including a reflective region that contains a defect and an opaque region that contains an absorption layer, wherein an absorber material is formed over the defect in the reflective region, and wherein a portion of the absorption layer is removed in the opaque region;
   configuring a pupil filter in the lithography system according to an illumination mode; and
   performing a lithography exposure process to a target with the mask and the pupil filter by the lithography system in the illumination mode,
   wherein the pupil filter blocks an amount of reflection light, reflected from the mask, to expose the target.

15. The method of claim 14, wherein the pupil filter is configured with an opening according to a dipole illumination pattern of the illumination mode, wherein a width of the opening is larger than a diameter of a dipole of the dipole illumination pattern.

16. The method of claim 14, wherein the pupil filter is configured with two openings, parallel to each other, according to a quasar illumination pattern of the illumination mode, wherein a width of the opening is larger than a diameter of a quasar in the quasar pattern mode.

17. The method of claim 14, wherein the pupil filter is configured with an opening according to a disk illumination pattern of the illumination mode, wherein a width of the opening is larger than a diameter of a disk of the disk pattern.

18. A method for extreme ultraviolet lithography (EUVL) process, comprising:
   loading a mask to a lithography system, wherein the mask includes a defect-repaired region over a defect in a first region and an absorption-layer-absent (ALA) region in a second region, separated by a distance from the defect-repaired region, and defines an integrated circuit (IC) pattern thereon, wherein the ALA region is formed by removing a portion of an absorption layer in an opaque region of the mask;

configuring a pupil filter in the lithography system according to a dipole pattern of an illumination mode to have an opening; and performing a lithography exposure process to a target with the mask and the pupil filter by the lithography system in the illumination mode with a dipole pattern, wherein the pupil filter blocks an amount of reflection light, reflected from the mask, to expose the target.

19. The method of claim 18, wherein the defect-repaired region is formed by:

depositing an absorption material over the defect in a reflective region of the mask; and wherein the ALA region is formed to have a distance from the defect region, wherein the distance is more than about 20 nm.

20. The method of claim 18, wherein a width of the opening is larger than a diameter of a dipole of the dipole pattern.

* * * * *